(12) United States Patent
Kang et al.

(10) Patent No.: US 11,764,005 B2
(45) Date of Patent: Sep. 19, 2023

(54) ELECTRONIC DEVICE INCLUDING KEY ASSEMBLY AND OPERATION METHOD THEREOF

(71) Applicant: Samsung Electronics Co., Ltd., Gyeonggi-do (KR)

(72) Inventors: Youjin Kang, Gyeonggi-do (KR); Changwon Son, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/287,649

(22) PCT Filed: Oct. 22, 2019

(86) PCT No.: PCT/KR2019/013890
§ 371 (c)(1),
(2) Date: Apr. 22, 2021

(87) PCT Pub. No.: WO2020/085762
PCT Pub. Date: Apr. 30, 2020

(65) Prior Publication Data
US 2021/0358698 A1 Nov. 18, 2021

(30) Foreign Application Priority Data
Oct. 23, 2018 (KR) .......................... 10-2018-0126470

(51) Int. Cl.
*H01H 13/14* (2006.01)
*H01H 13/04* (2006.01)
(Continued)

(52) U.S. Cl.
CPC ............ *H01H 13/14* (2013.01); *H01H 13/04* (2013.01); *H01H 13/20* (2013.01); *H01H 13/26* (2013.01); *H02N 2/04* (2013.01)

(58) Field of Classification Search
CPC ........ H01H 13/14; H01H 13/04; H01H 13/20; H01H 13/26; H02N 2/04; G06F 3/02;
(Continued)

(56) References Cited

U.S. PATENT DOCUMENTS 4,712,092 A 12/1987 Boldridge, Jr. et al.
4,806,908 A * 2/1989 Krupnik ................ G06F 3/0238
200/302.2
(Continued)

FOREIGN PATENT DOCUMENTS

JP 9-17271 A 1/1997
JP 9-190267 A 7/1997
(Continued)

OTHER PUBLICATIONS

Korean Office Action dated Jan. 26, 2023.
Notice of Patent Grant dated Jul. 19, 2023.

*Primary Examiner* — Lheiren Mae A Caroc
(74) *Attorney, Agent, or Firm* — Cha & Reiter, LLC

(57) ABSTRACT

An electronic device may include a housing including a first plate facing in a first direction and a second plate facing in a second direction opposite to the first direction, and a key assembly disposed on at least part of the first plate and including a plurality of keys for inputting data by a pressing operation, wherein the key assembly includes a keycap, a printed circuit board, a support structure disposed on the printed circuit board to support the keycap and supporting a pressing operation of the keycap, a contact point portion disposed between the support structure and the printed circuit board, a movable portion coupled to the support structure in the second direction, and an actuator coupled to the movable portion and providing a force for moving the keycap in the first direction or the second direction depending on whether the actuator is activated.

12 Claims, 16 Drawing Sheets

(51) Int. Cl.
*H01H 13/20* (2006.01)
*H01H 13/26* (2006.01)
*H02N 2/04* (2006.01)

(58) Field of Classification Search
CPC ...... G06F 3/023; G06F 3/0219; G06F 3/0216; G06F 3/0238
See application file for complete search history.

(56) References Cited

U.S. PATENT DOCUMENTS

| | | | |
|---|---|---|---|
| 5,657,860 | A | 8/1997 | Koike et al. |
| 5,867,729 | A | 2/1999 | Swonk |
| 2006/0012577 | A1 | 1/2006 | Kyrola |
| 2015/0084890 | A1 | 3/2015 | Ishikawa |
| 2015/0092330 | A1 | 4/2015 | Kershek |

FOREIGN PATENT DOCUMENTS

| | | | |
|---|---|---|---|
| JP | 2015069645 | A | 4/2015 |
| JP | 7-146741 | | 5/2019 |
| KR | 10-0197046 | B1 | 6/1999 |
| KR | 10-2001-0035991 | A | 5/2001 |
| KR | 10-2001-0047483 | A | 6/2001 |
| KR | 10-0463514 | B1 | 12/2004 |
| KR | 10-1034002 | B1 | 5/2011 |
| KR | 10-1092335 | B1 | 12/2011 |
| KR | 10-1299051 | B1 | 9/2013 |

\* cited by examiner

ELECTRONIC DEVICE INCLUDING KEY ASSEMBLY AND OPERATION METHOD THEREOF

CROSS REFERENCE TO RELATED APPLICATIONS

This application is a National Phase Entry of PCT International Application No. PCT/KR2019/013890, which was filed on Oct. 22, 2019, and claims a priority to Korean Patent Application No. 10-2018-0126470, which was filed on Oct. 23, 2018, the contents of which are incorporated herein by reference.

TECHNICAL FIELD

Various embodiments of the disclosure relate to an electronic device including a key assembly and an operating method thereof.

BACKGROUND ART

With the advance of information communication techniques and semiconductor techniques, electronic devices are being developed into multimedia devices for providing various multimedia services. For example, the multimedia service may include at least one of a game service, a voice call service, a message service, a broadcasting service, a wireless Internet service, a camera service, a video playback service, and a music playback service.

In addition, the electronic device may receive a command for controlling the multimedia service through an input device such as a mouse, keyboard, joystick, or the like coupled in a wired or wireless manner.

DISCLOSURE OF INVENTION

Technical Problem

In general, a command which generates a command for controlling a multimedia service may be generated by an input of some pre-specified keys among a plurality of keys included in a keyboard. Therefore, when a key other than the specified key is input by a user while using the multimedia service, there may be a problem in that operations interrupting the multimedia service are executed.

Various embodiments of the disclosure may provide an electronic device including a key assembly for preventing an input from occurring for a pre-specified key, and an operating method thereof.

Various embodiments of the disclosure may provide an electronic device including a key assembly for adjusting a position of a keycap so that a height of a pre-specified key is distinguished from a height of another key, and an operating method thereof.

Various embodiments of the disclosure may provide an electronic device including a key assembly having an actuator which vertically moves a support member to a lower portion of a keycap to fix a pre-specified key, and an operating method thereof.

Solution to Problem

According to various embodiments of the disclosure, an electronic device may include a housing including a first plate facing in a first direction and a second plate facing in a second direction opposite to the first direction, and a key assembly disposed on at least part of the first plate and including a plurality of keys for inputting data by a pressing operation. The key assembly may include a keycap, a printed circuit board, a support structure disposed on the printed circuit board to support the keycap and supporting a pressing operation of the keycap, a contact point portion disposed between the support structure and the printed circuit board, a movable portion coupled to the support structure in the second direction, and an actuator coupled to the movable portion and providing a force for moving the keycap in the first direction or the second direction depending on whether the actuator is activated.

According to various embodiments of the disclosure, an electronic device may include a housing including a first plate facing in a first direction and a second plate facing in a second direction opposite to the first direction, and a key assembly disposed on at least part of the first plate and including a plurality of keys for inputting data by a pressing operation. The key assembly may include a keycap, a printed circuit board, a support structure which supports the keycap, a restoring member disposed between the keycap and the printed circuit board to restore the pressed keycap to an original position, a connection rod coupled to the support structure in the second direction, and an actuator coupled to the connection rod and deformed depending on whether it is activated to provide a force for moving the connection rod in the first direction or the second direction.

Advantageous Effects of Invention

According to various embodiments of the disclosure, a position of a keycap is adjusted so that a height of a pre-specified key is distinguished from a height of another key, or a support member is moved vertically to a lower portion of the keycap so that the pre-specified key is fixed, thereby preventing an input unintended by a user from occurring.

According to various embodiments of the disclosure, in case of a game mode or an application mode which uses only a specific key, an error in which an undesired key is pressed can be avoided.

According to various embodiments of the disclosure, a possibility that only a necessary key is pressed can be increased.

BEST MODE FOR CARRYING OUT THE INVENTION

Figure 1:
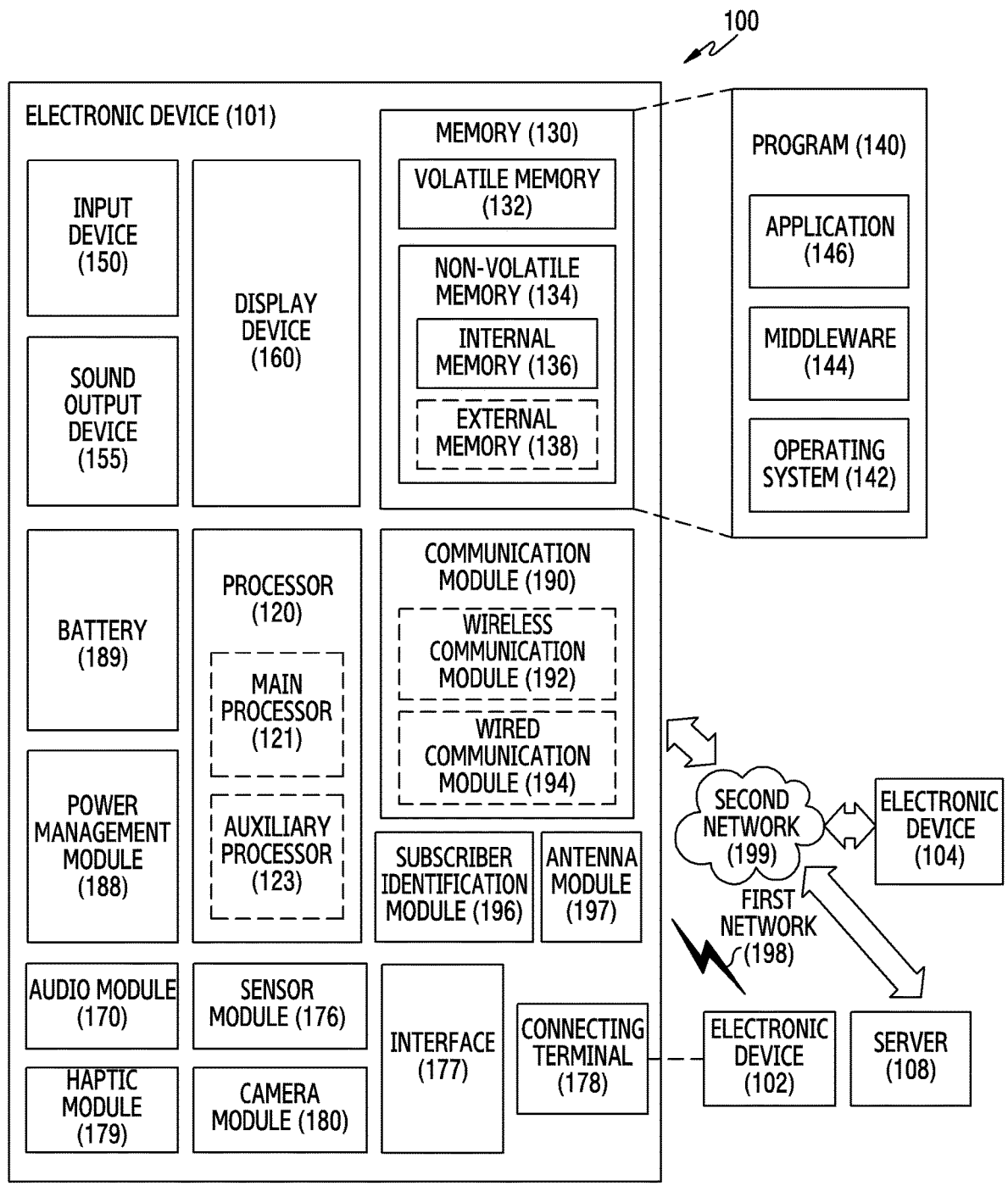
FIG. 1 is a block diagram of an electronic device in a network environment according to various embodiments.

Hereinafter, various embodiments of the disclosure are described with reference to the accompanying drawings. However, it should be appreciated that this is not intended to limit the technological features set forth herein to particular embodiments and include various changes, equivalents, or replacements for an embodiment of the disclosure. With regard to the description of the drawings, similar reference numerals may be used to refer to similar or related elements.

FIG. 1 is a block diagram illustrating an electronic device 101 in a network environment 100 according to various embodiments.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
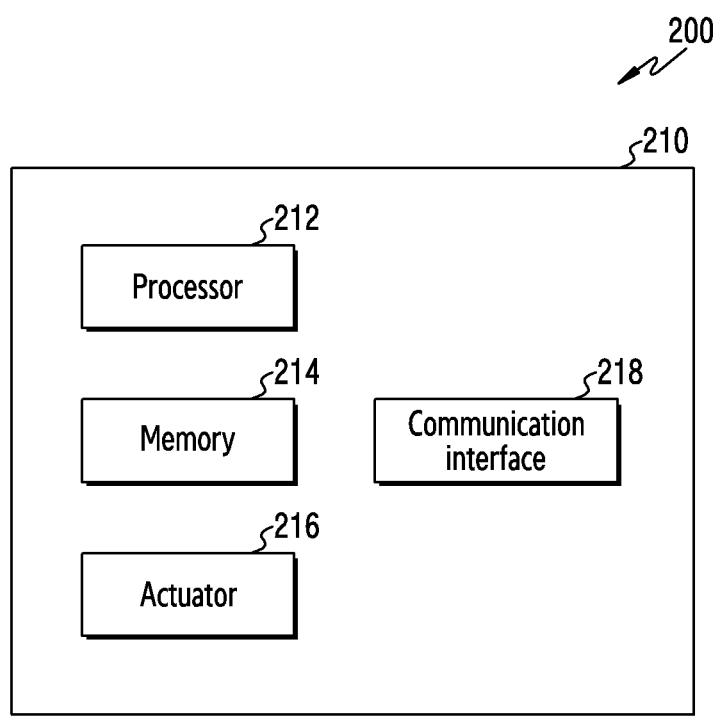
FIG. 2A is a drawing illustrating a structure of an input device according to various embodiments.
Figure 2B:
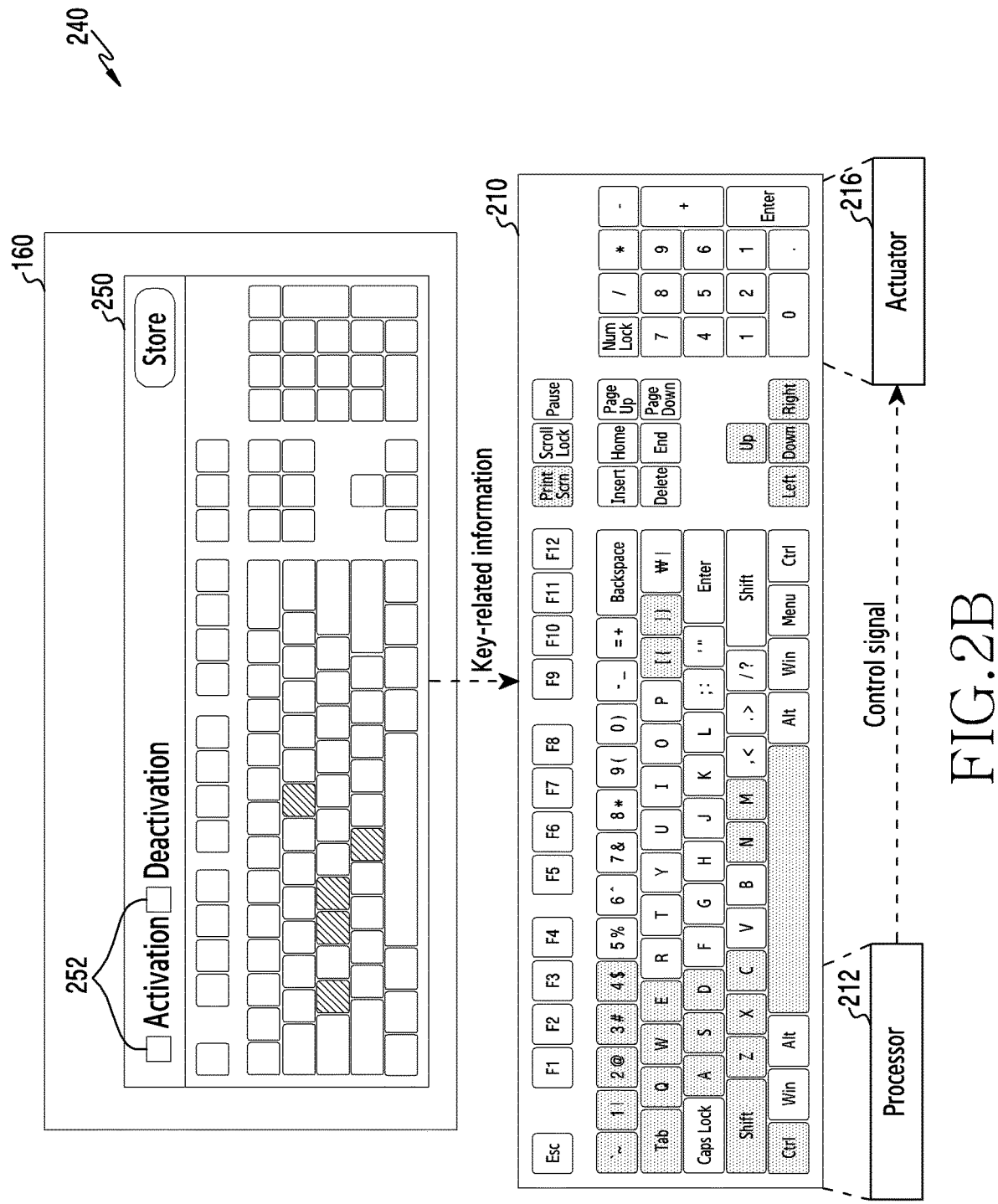
FIG. 2B is a drawing for describing an operation of specifying a deactivation key in an input device according to various embodiments.

FIG. 2A is a drawing 200 illustrating a structure of an input device 210 according to various embodiments. FIG. 2B is a drawing for describing an operation of specifying a deactivation key in the input device 210 according to various embodiments.

Referring to FIG. 2A, some components of the input device 210, for example, a keyboard, may correspond to an electronic device. For example, the input device 210 may include a processor 212, a memory 214, a communication interface 218, or the like. According to an embodiment, the input device 210 may further include an actuator 216. According to an embodiment, at least some of the components may be configured as single integrated component. For example, at least two of the processor 212, the memory 214, the actuator 216, and the communication interface 218 may be configured as a micom.

According to various embodiments, the processor 212 may specify at least one key among a plurality of keys included in the input device 210 as a deactivation key. The deactivation key may be specified through a key setting application executed by the electronic device 101. According to an embodiment, in response to detecting an input of a pre-specified key or a pre-specified key combination, the processor 212 may request the electronic device 101 to execute the key setting application. In response to executing the key setting application by the electronic device 101, a key setting screen configured to set at least one key selected by an input (e.g., a touch input, a voice input, etc.) as an activation key or a deactivation key is displayed through the display device 160 of the electronic device 101. As shown in FIG. 2B, a key setting screen 250 may include an image corresponding to the input device 210. In addition, the key setting screen 250 may also include a menu (e.g., a check box, etc.) 252 for selecting whether the selected at least one key is to be specified as the activation key or the deactivation key.

In addition, the processor 212 may receive information related to at least one key specified by a user from the key setting application executed by the electronic device 101. The information related to the key may include a unique value, for example, a keyboard scan code, assigned to each key of the input device 210. The information may be received based on a communication scheme defined between the input device 210 and the electronic device 101. For example, the defined communication scheme may include a Samsung Advanced BIOS Interface (SABI). However, this is for exemplary purposes only, and the embodiment of the disclosure is not limited thereto. The processor 212 may specify at least one key as the deactivation key, based on the information received through the key setting application. However, this is for exemplary purposes only, and the embodiment of the disclosure is not limited thereto. For example, the processor 212 may specify at least one key which is input for a specific period of time as the deactivation key, after detecting the input of the pre-specified key or the pre-specified key combination. The information on the specified deactivation key may be stored in an input device (e.g., the memory 214). According to various embodiments, the processor 212 may use information (e.g., a user identifier) for identifying a user to store information on the deactivation key. In this case, the processor 212 may identify the user who uses the input device 210, and may confirm the deactivation key related to the identified user. In addition, the processor 212 may additionally store authentication information (e.g., a password, fingerprint information, iris information, etc.) for identifying the user. According to various embodiments, the processor 212 may use information (e.g., an application identifier) for identifying an execution application to store the information on the deactivation key. In this case, the processor 212 may identify the application executed while using the input device, and may confirm the deactivation key related to the identified application.

According to various embodiments, in response to detecting an operation event, the processor 212 may determine whether a pre-specified deactivation key is present. The operation event may include a situation where power is supplied to the input device 210. As another example, the operation event may include a situation where an input of a power key provided in the input device 210 is detected.

According to various embodiments, if it is determined that the pre-specified deactivation key is present, the processor 212 may control the actuator 216. According to an embodiment, as shown in FIG. 2B, the processor 212 may provide a control signal to the actuator 216, based on the defined communication scheme. The actuator 216 may adjust a height of a key corresponding to the deactivation key, based on the control signal received from the processor 212. As described above, the defined communication scheme may include the SABI. For example, the processor 212 may provide the control signal to the actuator 216 so that a height of at least one key specified as the deactivation key is lower than a height of another key. In addition, the actuator 216 may allow at least one key specified as the deactivation key to be lowered by a pre-specified height, based on the received control signal. As another example, the processor 212 may provide the control signal to the actuator 216 so that the key specified as the deactivation key is not physically pressed. In addition, the actuator 216 may allow a connection rod (e.g., a shaft) coupled to the actuator 216 to be located at a lower portion of the at least one key specified as the deactivation key, based on the received control signal. In this case, the key specified as the deactivation key is restricted from being physically pressed since it is fixed by the connection rod located at the lower portion.

According to various embodiments, the communication interface 218 may support a specified protocol so as to be coupled with the electronic device in a wired or wireless manner. According to an embodiment, an execution request of the key setting application may be provided to the electronic device 101 through the communication interface 218. In addition, information related to the at least one key specified as the deactivation key may be received from the electronic device 101 through the communication interface 218.

Figure 3A:
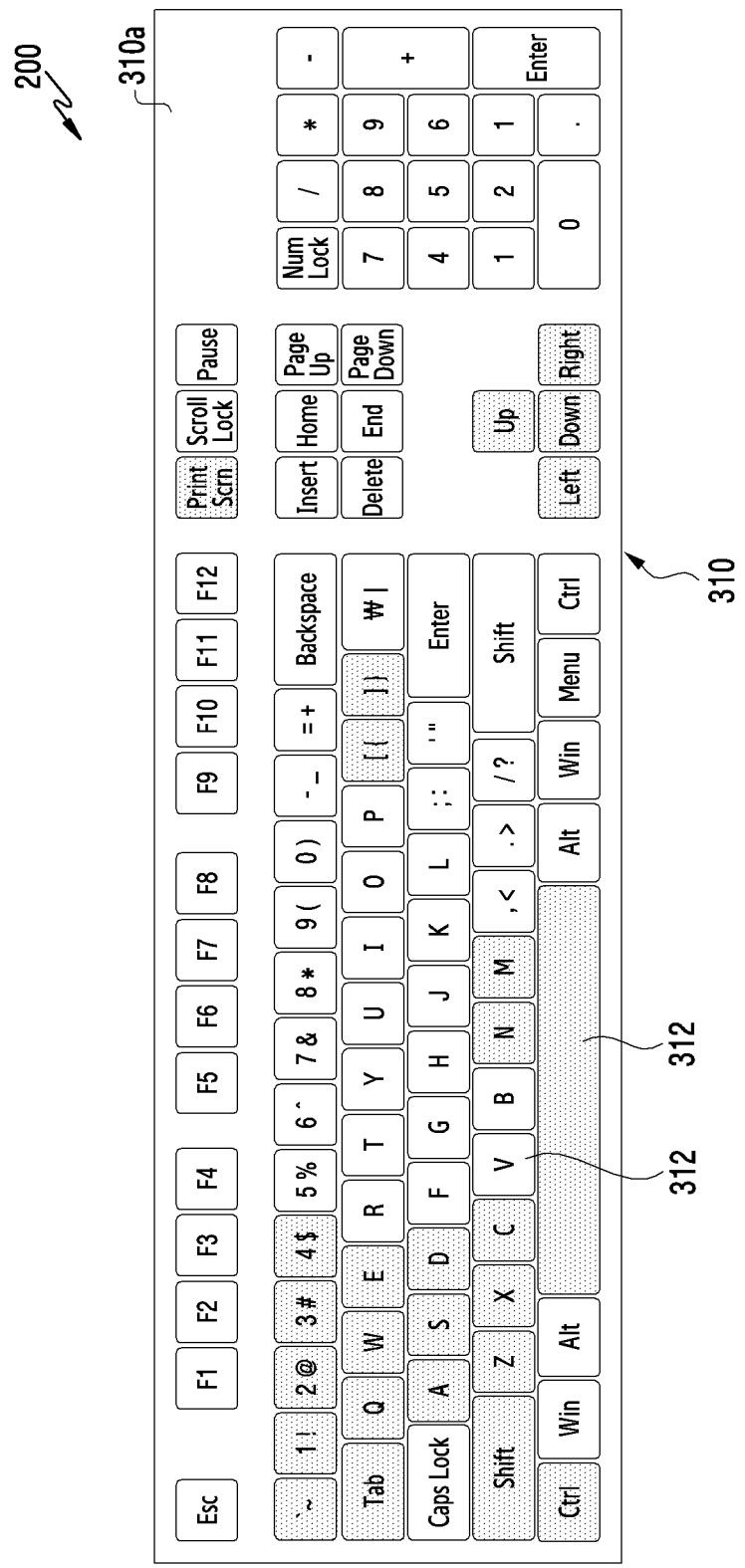
FIG. 3A is a plan view illustrating a keyboard device according to various embodiments.
Figure 3B:
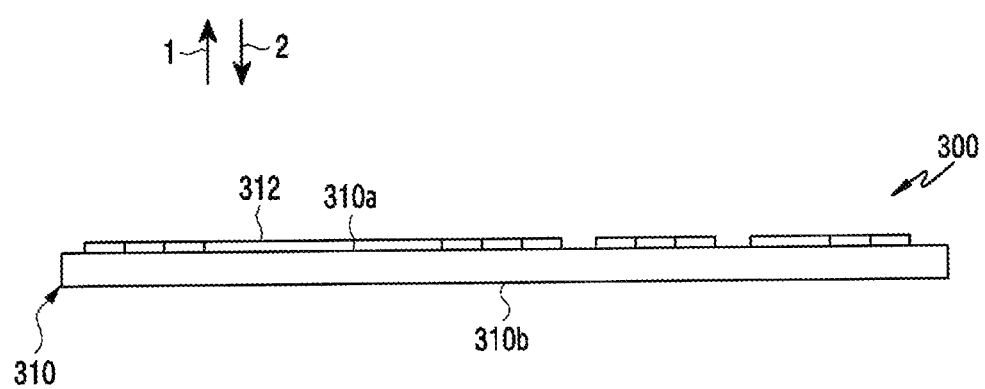
FIG. 3B is a side view illustrating a keyboard device according to various embodiments.

FIG. 3A is a plan view illustrating a keyboard device according to various embodiments. FIG. 3B is a side view illustrating a keyboard device according to various embodiments.

Referring to FIG. 3A and FIG. 3B, an electronic device according to various embodiments may be various types of device. The electronic device may include, for example, a portable communication device (e.g., a smartphone), a notebook computer, an Internet pad, a computer device, a portable multimedia device, a portable medical device, a camera, a wearable device, or a home appliance. The electronic device according to an embodiment of the disclosure is not limited to the aforementioned devices. A data input device may be used by being mounted or coupled to the electronic device. For example, the data input device may include a keyboard device 300.

According to an embodiment, the keyboard device (e.g., the input device 150 of FIG. 1) may be mounted as a key input device of the electronic device such as a notebook computer, and may be coupled to a main body and used as a data input device. The keyboard device 300 may include a housing 310 for protecting a key assembly. According to an embodiment, the housing 310 may include a first plate 310*a* facing in a first direction 1 and a second plate 310*b* facing in a second direction 2 opposite to the first direction 1. For example, the first plate 310*a* may include an upper face of the housing 310, and the second plate 310*b* may include a lower face of the housing.

According to an embodiment, the housing 310 may have a plurality of keys 312 arranged in at least some regions of the first plate 310*a*. The plurality of keys 312 may include a QWERTY key array. The keys 312 disposed to the first plate 310*a* may be the keycap 51. According to the array of the keys 312, a user may input desired data by pressing a key. Only the plurality of keycaps 51 of the keyboard device may be shown in the figure.

According to an embodiment, in case of a game mode or an application mode which uses only a specific key, an operation of an actuator (e.g., the actuator 216 of FIG. 2) may prevent an undesired key from being pressed in the keyboard device 300, thereby increasing a possibility that only a necessary key is pressed.

Hereinafter, a structure and operation of an actuator capable of preventing an undesired key from being pressed in the keyboard device 300 or increasing a possibility that only a necessary key is pressed will be described.

Figure 4A:
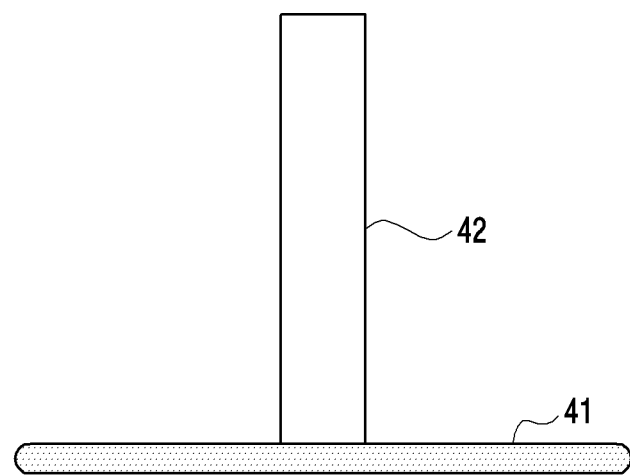
FIG. 4A is a side view illustrating an actuator in a neutral state according to various embodiments.
Figure 4B:
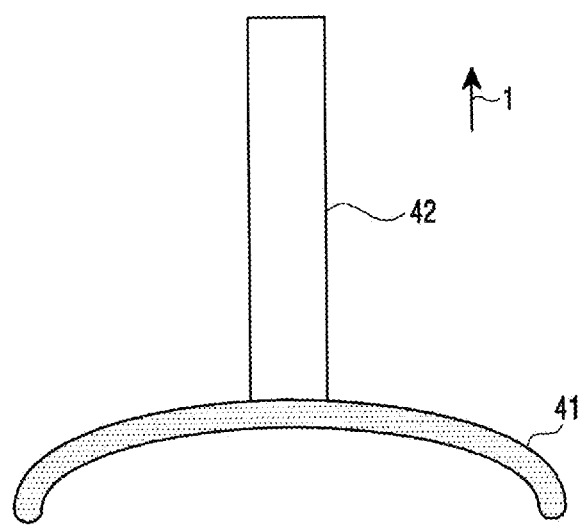
FIG. 4B is a side view illustrating an actuator which is activated by applying current according to various embodiments.
Figure 4C:
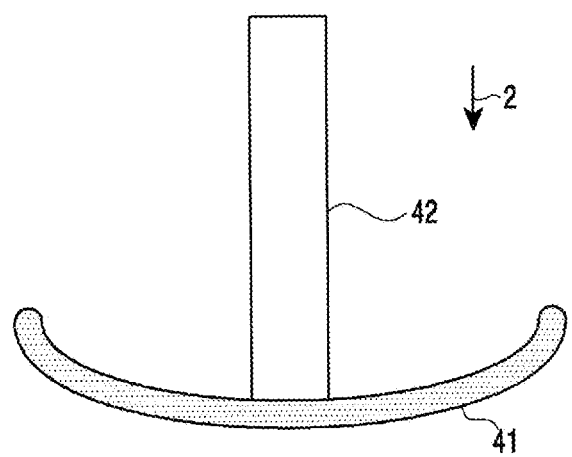
FIG. 4C is a side view illustrating an actuator which is deactivated by interrupting current according to various embodiments.

FIG. 4A is a side view illustrating an actuator in a neutral state according to various embodiments. FIG. 4B is a side view illustrating an actuator which is activated by applying current according to various embodiments. FIG. 4C is a side view illustrating an actuator which is deactivated by interrupting current according to various embodiments.

Referring to FIG. 4A to FIG. 4C, an actuator 41 according to various embodiments may be a member which is elastically deformed depending on whether current is applied. For example, the actuator 41 is constructed of an elastic material, and thus is elastically deformed depending on whether current is applied or whether a specific signal is applied, and at least part thereof may contain a piezoelectric ceramic material.

According to an embodiment, when a first signal is applied, the actuator 41 may be deformed in a convex shape in a first direction, and thus may provide a force for moving a rod fixed to the actuator 41 in the first direction. Meanwhile, when a second signal is applied, the actuator 41 may be deformed in a convex shape in a second direction, and thus may provide the force for moving the rod fixed to the actuator 41 in the second direction.

Hereinafter, a structure of a key assembly disposed to a housing of a keyboard device will be described with reference to the accompanying drawings.

Figure 5A:
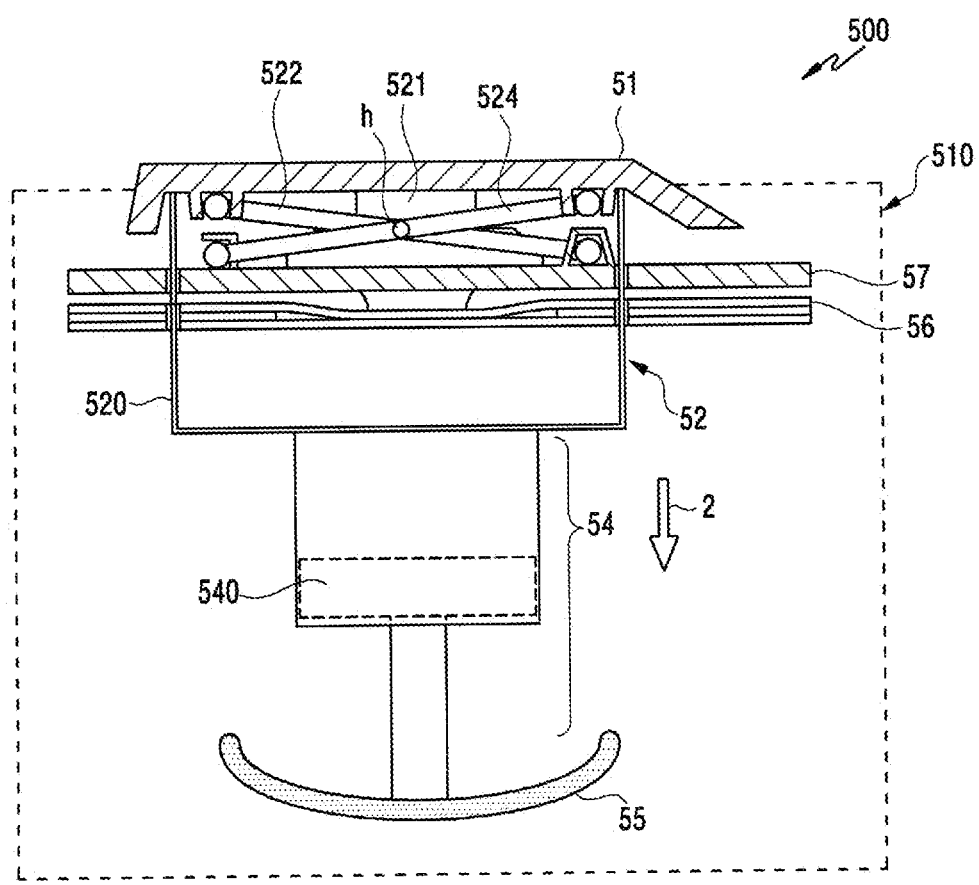
FIG. 5A is a cross-sectional view illustrating a structure of a key assembly according to various embodiments of the disclosure, and illustrates a state where an actuator is activated to move a keycap downward.
Figure 5B:
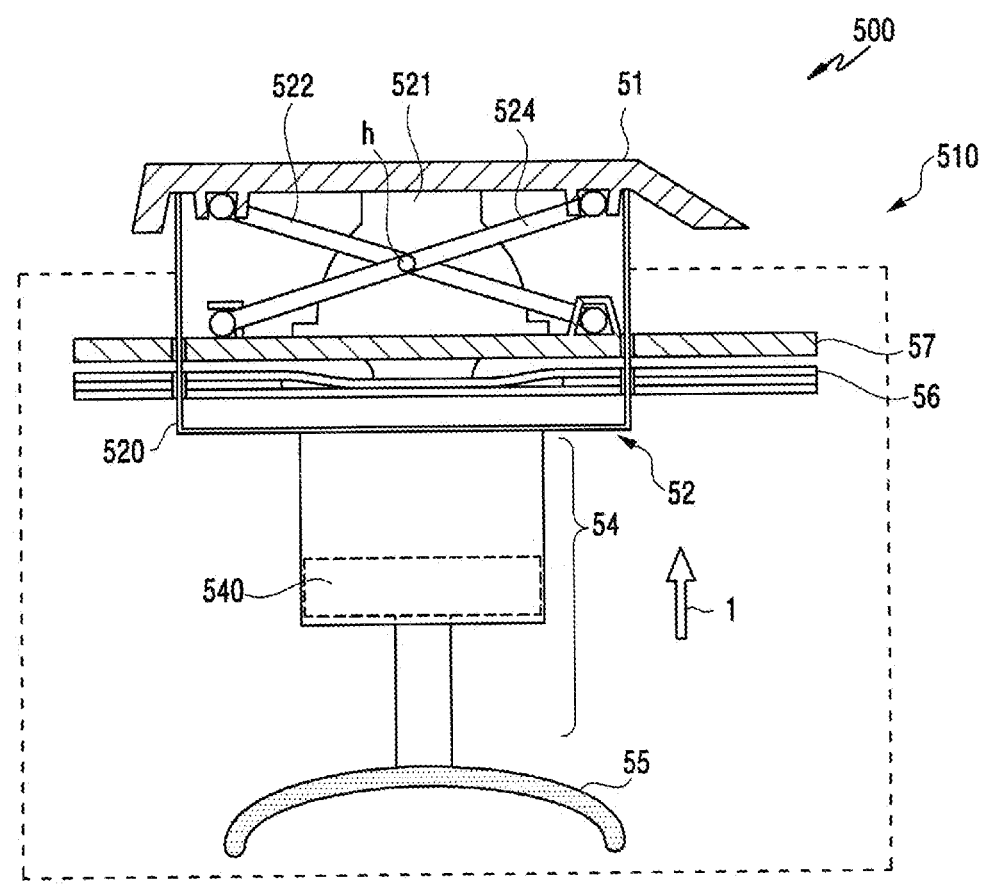
FIG. 5B is a cross-sectional view illustrating a structure of a key assembly according to various embodiments of the disclosure, and illustrates a state where an actuator is deactivated to move a keycap upward.

FIG. 5A is a cross-sectional view illustrating a structure of a key assembly according to various embodiments of the disclosure, and illustrates a state where an actuator is activated to move a keycap downward. FIG. 5B is a cross-sectional view illustrating a structure of a key assembly according to various embodiments of the disclosure, and illustrates a state where an actuator is deactivated to move a keycap upward.

Referring to FIG. 5A and FIG. 5B, a key assembly 500 according to various embodiments may be mounted in a housing 510. According to an embodiment, the key assembly 500 is a structure which enables a data input operation by pressing a keycap 51, and may be a structure which prevents a pressing operation of a specific key in a specific mode.

According to an embodiment, the key assembly 500 may include the keycap 51, a support structure 52, a contact portion, a movable portion 54, and an actuator 55. Regarding a printed circuit board 56, the keycap 51, the contact portion, and the support structure 52 may be partially disposed in a first direction 1 of the printed circuit board 56, and the movable portion 54 and the actuator 55 may be disposed in a second direction 2 of the printed circuit board 56.

According to an embodiment, the support structure 52 may include at least one or more plungers 522 and 524 supporting the keycap 51 from a substrate 57, a restoring member 521 which restores the pressed keycap 51 to an original position, and a support member 520 which supports the keycap 51.

Plungers according to an embodiment may include the first and second plungers 522 and 524. The first and second plungers 522 and 524 may support a vertical movement of the keycap 51. Each of the first and second plungers 522 and 524 may move about a hinge axis h in a seesaw-like manner.

The restoring member 521 according to an embodiment may be disposed between the keycap 51 and the substrate 57. The restoring member 521 may be constructed of an elastic material, for example, a rubber material, and may provide a force for restoring the pressed keycap 51 to the original position. The restoring member 521 may be compressed by pressing the keycap 51, and may be elongated by releasing the pressing. The restoring member 521 may have a contact portion constructed therein.

The support member 520 according to an embodiment may have one end coupled to the keycap 51 and the other end coupled to the movable portion 54. According to an embodiment, the support member 520 may be constructed to be vertically movable with respect to the substrate 57. The support member 520 may transfer an operating force of the actuator 55 to the keycap 51.

The movable portion 54 according to an embodiment may be coupled to the support member 520 of the support structure 52. The movable portion 54 may transfer a force provided by the actuator 55 to the support structure 52. The movable portion 54 may include a piston structure 540.

For example, in case of a game mode or a specific application execution mode, when current is applied (e.g., activated) to the actuator 55 and thus the actuator 55 has a convex shape in the second direction 2, the movable portion 54 may be pulled in the second direction 2 so that the keycap 51 moves downward. With the downward movement of the keycap 51, the restoring member 521 also moves downward to be compressed, and the first and second plungers 522 and 524 also move downward. A state where the keycap 51 moves downward may be maintained by the actuator 55. Since this is a state where the keycap 51 moves downward, an erroneous operation in which an undesired key is pressed can be minimized, and a possibility of pressing only a necessary key can be increased.

The actuator 55 according to an embodiment may be coupled to an end of the movable portion 54. When current is applied (e.g., activated) or a first signal is applied to the actuator 55, the actuator 55 may be deformed in a convex shape in the second direction 2, and the movable portion 54 may move in the second direction 2, so that the keycap 51 moves downward in the second direction 2. This state may be maintained by the actuator 55. According to an embodiment, when current to be applied to the actuator 55 is interrupted (e.g., deactivated) or when a second signal is applied, the actuator 55 may be deformed in a convex shape in the first direction, and the movable portion 54 may move in the first direction 1 so that the keycap 51 moves upward in the first direction 1. This state may be a state where the keycap 51 can perform an input operation by a normal pressing operation.

Figure 6A:
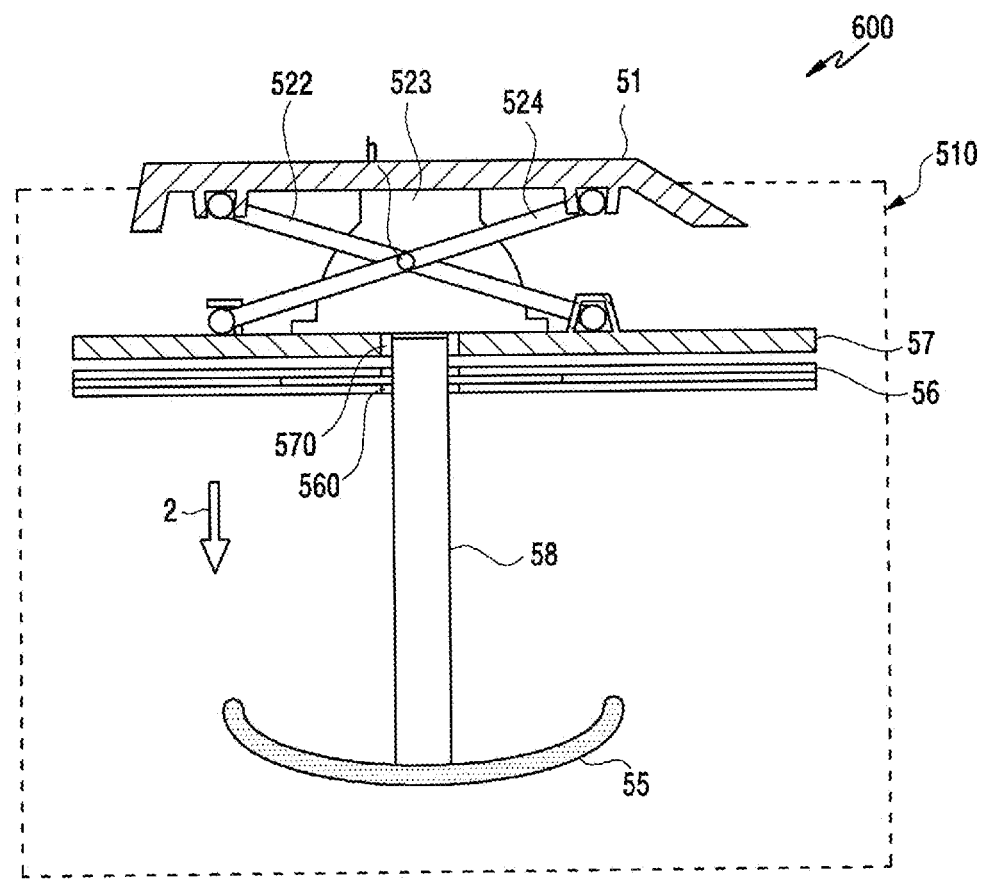
FIG. 6A is a cross-sectional view illustrating a structure of a key assembly according to various embodiments of the disclosure, and illustrates a state where an actuator is activated to enable a normal key input operation.
Figure 6B:
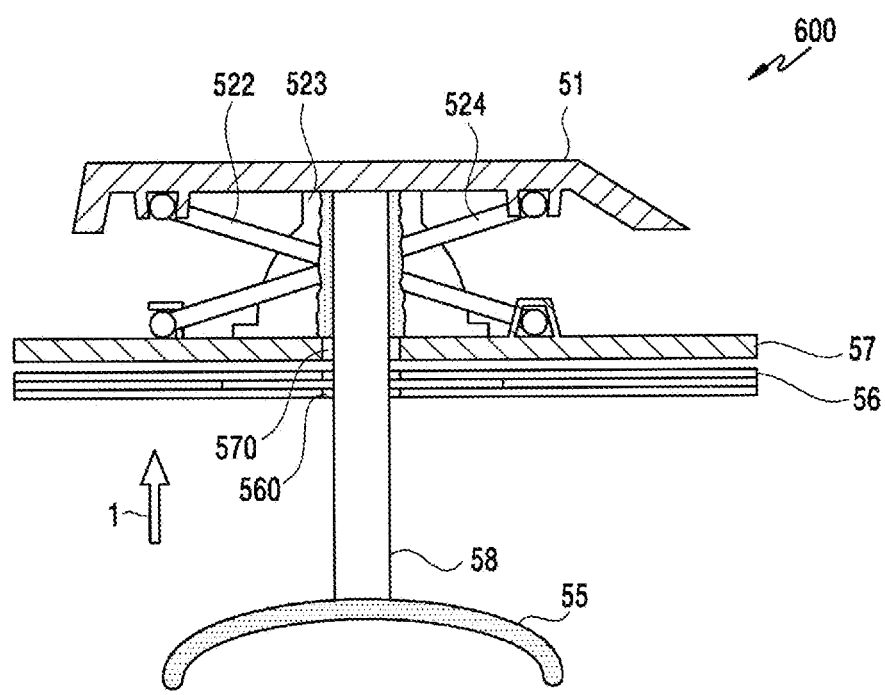
FIG. 6B is a cross-sectional view illustrating a structure of a key assembly according to various embodiments of the disclosure, and illustrates a state where an actuator is deactivated to disable a normal key input operation by a connection rod.

FIG. 6A is a cross-sectional view illustrating a structure of a key assembly according to various embodiments of the disclosure, and illustrates a state where an actuator is activated to enable a normal key input operation. FIG. 6B is a cross-sectional view illustrating a structure of a key assembly according to various embodiments of the disclosure, and illustrates a state where an actuator is deactivated to disable a normal key input operation by a connection rod. Descriptions of a support structure will be omitted.

Referring to FIG. 6A and FIG. 6B, a key assembly 600 according to various embodiments will be described compared to the key assembly 500 of FIG. 5A and FIG. 5B. To avoid redundancy, the same structure will be omitted, and only different structures will be described. A support structure of FIG. 5A and FIG. 5B will be omitted in the drawing.

The key assembly 600 according to various embodiments may include an actuator 55 and a connection rod 58 coupled to the actuator 55. According to an embodiment, when the connection rod 58 is deformed in a convex shape in a second direction by applying current to the actuator 55, a keycap 51 may maintain a correct position, and desired data may be input by a pressing operation.

According to an embodiment, when current applied to the connection rod 58 is interrupted, the actuator 55 may be deformed in a convex shape in a first direction, and the connection rod 58 is inserted into an opening of a restoring member 521 to disable pressing of the keycap 51. That is, a normal input operation of pressing the keycap 51 may be disabled. A reference numeral 570 may denote a through-hole on a substrate 57, and a reference numeral 560 may denote a through-hole on a Flexible Printed Circuit Board (FPCB) 56.

Figure 7A:
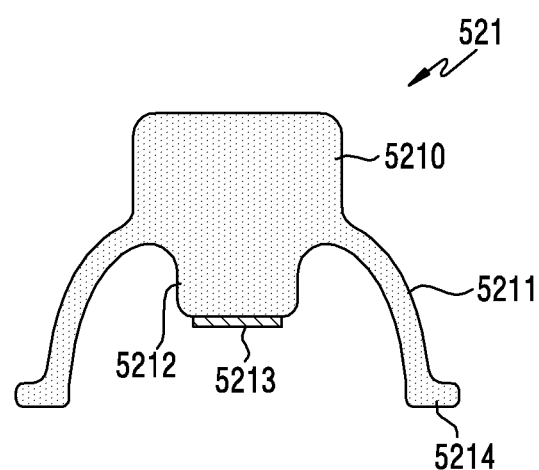
FIG. 7A is a cross-sectional view illustrating a structure of a restoring member applied to the key assembly of FIG. 5A according to various embodiments of the disclosure.

FIG. 7A is a cross-sectional view illustrating a structure of a restoring member applied to the key assembly of FIG. 5A according to various embodiments of the disclosure.

Referring to FIG. 7A, a restoring member 521 according to various embodiments is disposed between a substrate (e.g., the substrate 57 of FIG. 5A) and a keycap (e.g., the keycap 51 of FIG. 5A) as an elastic member for restoring the pressed keycap 51 to an original position, and may include a body 5210, a dome portion 5211 of a rubber material, a contact protrusion 5212, and a contact portion 5213. According to an embodiment, the restoring member 521 is an elastic material, e.g., a rubber material, and may be elastically deformed. For example, the restoring member 521 may be pressed as the keycap 51 is pressed, and may be restored to an original state by releasing a force applied for pressing.

According to an embodiment, the restoring member 521 may include the body 5210 and the dome portion 5211 extending from the body 5210 in a second direction. The dome portion 5211 may be constructed to be relatively thin to provide a restoration force of the contact protrusion 5212. The body 5210 according to an embodiment may include a contact protrusion protruding in the second direction 2, and the contact protrusion 5212 may include the contact portion 5213, e.g., a carbon contact portion. The contact portion 5213 may move downward so that a contact portion (not shown) of a printed circuit board (e.g., the printed circuit board 56 of FIG. 5A) is in contact therewith to generate a signal. According to an embodiment, the body 5210 may include a support portion 5214 at an end portion.

Figure 7B:
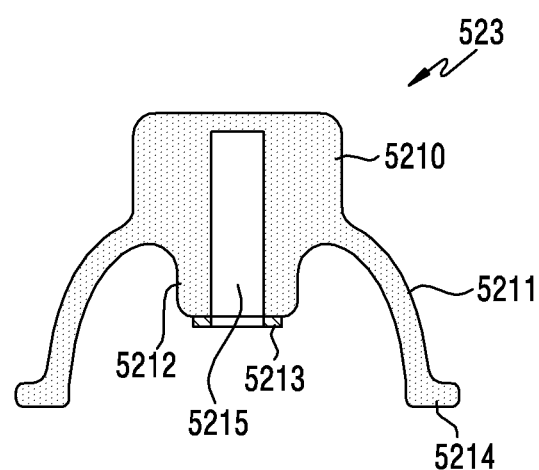
FIG. 7B is a cross-sectional view illustrating a structure of a restoring member applied to the key assembly of FIG. 6A according to various embodiments of the disclosure.

FIG. 7B is a cross-sectional view illustrating a structure of a restoring member applied to the key assembly of FIG. 6A according to various embodiments of the disclosure.

Referring to FIG. 7B, a restoring member 523 according to various embodiments will be described compared to the restoring member 521 of FIG. 7A. To avoid redundancy, the same structure will be omitted, and only differences will be described.

According to an embodiment, the restoring member 523 may further have an opening 5215 constructed to insert a connection rod (e.g., the connection rod 58 of FIG. 6A). The opening 5215 extends in a longitudinal direction of the body 5210, and may have a shape similar to a shape of the connection rod 58. For example, the opening 5215 may be a cylindrical space.

Figure 8:
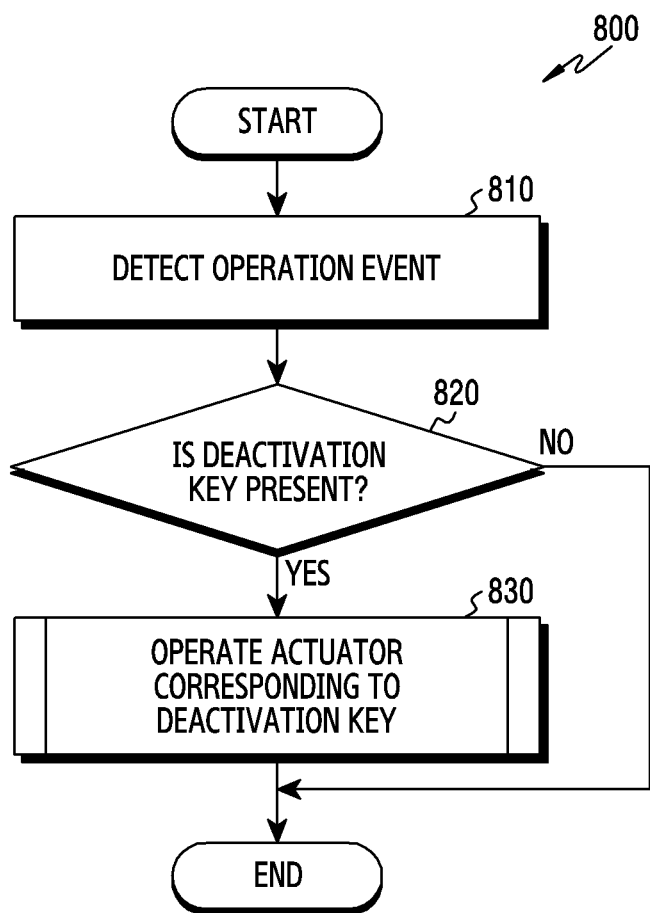
FIG. 8 is a flowchart for processing a deactivation key in an input device according to various embodiments.

FIG. 8 is a flowchart 800 for processing a deactivation key in an input device according to various embodiments. In the following embodiments, the respective operations may be performed sequentially, but are not necessarily performed sequentially. For example, orders of the respective operations may be changed, and at least two operations may be performed in parallel. The input device of FIG. 8 may be the input device 210 of FIG. 2.

Referring to FIG. 8, in operation 810, the input device 210 (e.g., the processor 212 of FIG. 2) according to various embodiments may detect an operation event. The operation event may include at least one of a situation where power is supplied to the input device 210, a situation where an input of a power key provided in the input device 210 is detected, and a situation where the input device 210 is coupled with the electronic device 101 in a wired or wireless manner.

In operation 820, the input device 210 (e.g., the processor 212) according to various embodiments may determine whether a deactivation key is present. The deactivation key may be defined as a pre-specified key for restricting generation of a command corresponding to an input among a plurality of keys provided in the input device 210. According to an embodiment, the processor 212 may determine whether information on at least one key specified as the deactivation key is stored. If the stored information is not present, it may be referred as that the key specified as the deactivation key is not present.

According to various embodiments, if it is determined that the deactivation key is not present, the input device 210 (e.g., the processor 212) may detect a key input and may perform a typical operation of generating a command for the input.

According to various embodiments, if it is determined that the deactivation key is present, in operation 830, the input device 210 (e.g., the processor 212) may operate the actuator 216 (e.g., the actuator 55 of FIG. 5A) corresponding to the deactivation key. The actuator 215 may adjust a height of a key corresponding to the deactivation key. For example, the processor 212 may operate the actuator 216 so that a height of at least one key specified as the deactivation key is lower than a height of another key. In addition, the actuator 216 may fix a key so that the key specified as the deactivation key is not physically pressed. For example, the processor 212 may operate the actuator 216 so that a shaft is located at a lower portion of the at least one key specified as the deactivation key.

Figure 9:
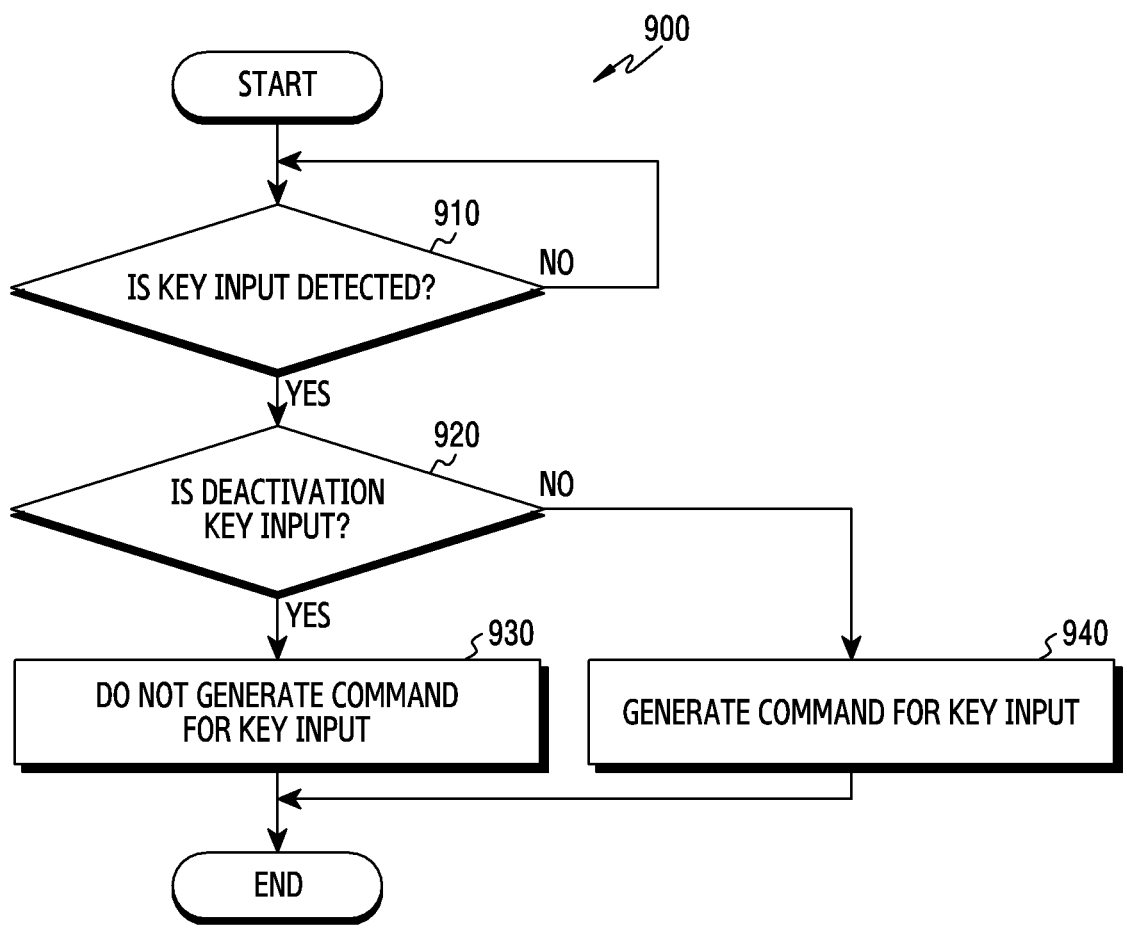
FIG. 9 is a flowchart for operating an actuator in an input device according to various embodiments.

FIG. 9 is a flowchart 900 for operating an actuator in an input device according to various embodiments. Operations of FIG. 9 described below represent various embodiments of the operation 830 of FIG. 8. In the following embodiments, the respective operations may be performed sequentially, but are not necessarily performed sequentially. For example, orders of the respective operations may be changed, and at least two operations may be performed in parallel. The input device of FIG. 9 may be the input device 210 of FIG. 2.

Referring to FIG. 9, in operation 910, the input device 210 (e.g., the processor 212 of FIG. 2) according to various embodiments may determine whether a key input is detected.

According to various embodiments, if the key input is not detected, the input device (e.g., the processor 212) may repeat an operation of detecting whether there is a key input. For example, an operation related to the operation 910 may be performed.

According to various embodiments, if the key input is detected, in operation 920, the input device 210 (e.g., the processor 212) may determine whether a key of which an input is detected is a key specified as a deactivation key.

According to various embodiments, if it is determined as the input of the key specified as the deactivation key, in operation 930, the input device 210 (e.g., the processor 212) may not generate a command for the key input. For example, the processor 212 may skip an operation of providing the electronic device 101 with the command for the key input.

According to various embodiments, if it is determined as an input of a key not specified as the deactivation key, in operation 940, the input device 210 (e.g., the processor 212) may generate the command for the key input. For example, the processor 212 may provide the electronic device 101 with the command of the key input.

The invention claimed is:

1. An electronic device comprising:
a housing comprising a first plate facing in a first direction and a second plate facing in a second direction opposite to the first direction; and
a key assembly disposed on at least part of the first plate and comprising a plurality of keys for inputting data by a pressing operation, wherein the key assembly comprises:
a keycap;
a printed circuit board;
a support structure disposed on the printed circuit board to support the keycap and supporting a pressing operation of the keycap;
a contact point portion disposed between a portion of the support structure and the printed circuit board;
a movable portion coupled to the support structure in the second direction; and
an actuator coupled to the movable portion and providing a force for moving the keycap in the first direction or the second direction depending on whether the actuator is activated,
wherein the actuator comprises an elastic material, and is elastically deformed depending on the activation.

2. The electronic device of claim 1, wherein the actuator is elastically deformed convexly in the first direction or elastically deformed convexly in the second direction.

3. The electronic device of claim 2, wherein the actuator provides a force which moves the keycap downward in the second direction and then maintains a state of being moved downward.

4. The electronic device of claim 1, wherein the actuator comprises a piezoelectric ceramic material.

5. The electronic device of claim 1, wherein the support structure comprises:
a support member coupled to the keycap and constraining the keycap to the printed circuit board in a vertically movable manner;
a restoring member disposed between the printed circuit board and the keycap to restore the pressed keycap in the first direction; and
at least one plunger disposed between the printed circuit board and the keycap to support a vertical movement of the keycap.

6. The electronic device of claim 5, wherein the restoring member comprises a dome portion of a rubber material.

7. The electronic device of claim 1, wherein the movable portion comprises a piston structure.

8. An electronic device comprising:
a housing comprising a first plate facing in a first direction and a second plate facing in a second direction opposite to the first direction; and
a key assembly disposed on at least part of the first plate and comprising a plurality of keys for inputting data by a pressing operation, wherein the key assembly comprises:
a keycap;
a printed circuit board;
a support structure which supports the keycap;
a restoring member disposed between the keycap and the printed circuit board to restore the pressed keycap to an original position;
a connection rod coupled to the support structure in the second direction; and
an actuator coupled to the connection rod and deformed depending on whether it is activated to provide a force for moving the connection rod in the first direction or the second direction,
wherein the connection rod moves upward in the first direction by an operation of the actuator, and thus the keycap is prevented from moving downward to disable an input operation of the keycap.

9. The electronic device of claim 8, wherein the actuator is elastically deformed convexly in the first direction or elastically deformed convexly in the second direction.

10. The electronic device of claim 8, wherein the restoring member further comprises an opening for inserting the connection rod.

11. The electronic device of claim 8, wherein the actuator provides a force which moves the keycap upward in the first direction and then maintains a state of being moved upward.

12. The electronic device of claim 8, wherein the actuator comprises a piezoelectric ceramic material.

* * * * *